(12) United States Patent
Bodla et al.

(10) Patent No.: US 10,598,443 B2
(45) Date of Patent: Mar. 24, 2020

(54) THERMAL MANAGEMENT SYSTEM

(71) Applicant: GENERAL ELECTRIC COMPANY, Schenectady, NY (US)

(72) Inventors: Karthik Kumar Bodla, Watervliet, NY (US); Hendrik Pieter Jacobus de Bock, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 468 days.

(21) Appl. No.: 15/202,789

(22) Filed: Jul. 6, 2016

(65) Prior Publication Data

US 2017/0023313 A1    Jan. 26, 2017

Related U.S. Application Data

(60) Provisional application No. 62/188,956, filed on Jul. 6, 2015.

(51) Int. Cl.
| | |
|---|---|
| *F28F 3/04* | (2006.01) |
| *H01L 23/367* | (2006.01) |
| *F28F 13/02* | (2006.01) |
| *F28F 3/02* | (2006.01) |

(52) U.S. Cl.
CPC .......... *F28F 3/04* (2013.01); *F28F 3/02* (2013.01); *F28F 13/02* (2013.01); *H01L 23/3672* (2013.01)

(58) Field of Classification Search
CPC ...... F28F 3/04; F28F 3/02; F28F 13/02; F28F 13/06; F28F 2215/10; F28F 2215/04; H01L 23/3672

See application file for complete search history.

(56) References Cited

U.S. PATENT DOCUMENTS 3,217,793 A * 11/1965 Coe .......................... F28F 1/12
                                                       165/185
4,899,810 A *  2/1990 Fredley ................. B64G 1/506
                                                       165/104.14
(Continued)

FOREIGN PATENT DOCUMENTS

| EP | 0883179 A2 * | 12/1998 | ......... H01L 23/3672 |
| EP | 2843699 A1 | 3/2015 | |

(Continued)

OTHER PUBLICATIONS

International Search Report and Written Opinion issued in connection with corresponding PCT Application No. PCT/US2016/041152 dated Sep. 20, 2016.
S. Krishnan et al., "A Novel Hybrid Heat Sink Using Phase Change Materials for Transient Thermal Management of Electronics," Inter Society Conference on Thermal Phenomena, p. 310-318, 2004.

(Continued)

*Primary Examiner* — Jianying C Atkisson
*Assistant Examiner* — Jose O Class-Quinones
(74) *Attorney, Agent, or Firm* — Christopher R. Carroll; The Small Patent Law Group LLC

(57) ABSTRACT

Embodiments of a thermal management system are provided herein. In some embodiments, a thermal management system may include a base plate; and a plurality of three dimensional fins coupled to the base, wherein each of the plurality of three dimensional fins comprises a first portion extending away from the base in a first direction and a second a portion extending away from the first portion in a second direction different from the first direction.

15 Claims, 7 Drawing Sheets

(56) References Cited

U.S. PATENT DOCUMENTS

| | | | | |
|---|---|---|---|---|
| 5,020,586 | A | * | 6/1991 | Mansingh ............... F28F 3/02 165/185 |
| 5,375,655 | A | * | 12/1994 | Lee ........................ F28F 3/02 165/185 |
| 5,946,190 | A | * | 8/1999 | Patel ................. H05K 7/20154 165/104.21 |
| 6,418,020 | B1 | * | 7/2002 | Lin ..................... H01L 23/367 165/80.3 |
| 6,453,987 | B1 | * | 9/2002 | Cheng .................... F28F 3/022 165/80.3 |
| 8,502,425 | B2 | | 8/2013 | Matsumoto et al. |
| 2002/0189790 | A1 | * | 12/2002 | Wong ................. H01L 21/4878 165/80.3 |
| 2009/0032234 | A1 | * | 2/2009 | Wayman ................... F28F 3/06 165/185 |
| 2011/0012494 | A1 | * | 1/2011 | Yoo ...................... F21V 29/004 313/46 |
| 2011/0132570 | A1 | * | 6/2011 | Wilmot ................... B64D 13/00 165/41 |
| 2015/0013955 | A1 | | 1/2015 | Lin et al. |

FOREIGN PATENT DOCUMENTS

| | | |
|---|---|---|
| JP | 5846660 A | 3/1983 |
| JP | 2000021650 A | 1/2000 |

OTHER PUBLICATIONS

M.S, Aris et al., "An Experimental Investigation Into the Deployment of 3-D, Finned Wing and Shape Memory Alloy Vortex Generators in a Forced Air Convection Heat Pipe Fin Stack," Applied Thermal Engineering, vol. 31, Issue 14-15, pp. 2230-2240, Oct. 2011.

R. Charles et al., "An optimized heat dissipation fin design applicable for natural convection augmentation", 9th International Microsystems, Packaging, Assembly and Circuits Technology Conference (IMPACT): Challenges of Change—Shaping the Future, IMPACT 2014—Proceedings, IEEE No. CFP1459B-ART, pp. 61-64, Oct. 22-24, 2014.

Office Action issued in connection with corresponding CA Application No. 2989645 dated Sep. 18, 2018.

* cited by examiner

W/m²-K

THERMAL MANAGEMENT SYSTEM

CROSS REFERENCE TO RELATED APPLICATIONS

This non-provisional application claims the benefit of priority under 35 U.S.C. § 119(e) to U.S. Provisional Patent Application Ser. No. 62/188,956, entitled "PASSIVE COOLING STRUCTURES FOR AUGMENTED HEAT TRANSFER IN ELECTRONICS" filed on Jul. 6, 2015, which is herein incorporated in its entirety by reference.

BACKGROUND

The field of the disclosure relates generally to cooling and thermal management, more particularly, to systems, devices and methods of operation for heat sinks/fins and extended surfaces thereof.

Conventional electronics typically generate a significant amount of heat during routine operation. If not managed, such generated heat may accumulate, thereby leading to a rise in temperature and eventual damage or failure of components within the electronics (e.g., processors, integrated circuits, or the like). For example, some estimates indicate that for every 10° C. (18° F.) rise in temperature, the life of the components may decrease by about 50%. In addition, the heat generated is waste energy, owing to inherent inefficiencies associated with converting input electrical energy to useful work. As such, managing the generated heat thus becomes imperative to ensuring the safe and reliable operation of the designed components. Moreover, such heat (thermal) management is a critical bottleneck in achieving improved power density and/or miniaturization of electronics.

Conventional thermal management mechanisms typically include providing one or more thermal paths configured to allow for a flow of heat away from temperature sensitive components. For example, in devices that utilize, for example, silicon or silicon based materials, heat generated at the silicon traverses through various components in a thermal path, such as the chip case, thermal interface material, heat spreader, wedgelock, outer chassis, or the like, before ultimately being rejected to the surrounding air.

Typically, fins (extended surfaces made of high thermal conductivity material and are commonly integral to the prime surface) are utilized to facilitate such a rejection of heat and/or increase a transfer of heat to the surrounding air. When properly designed, the fins enhance the surface area available for convection without a significant temperature difference between the base (prime surface) and tip of the fins, thus increasing the efficiency of the fins. However, the inventors have observed that conventionally configured fins have limited effectiveness and are insufficient for applications where the electronics are subject to varying requirements or are exposed to dynamic or changing environments, for example, such as in aircraft electronics or avionics.

Therefore, the inventors have provided embodiments of an improved passive cooling structure.

BRIEF DESCRIPTION

In some embodiments, a thermal management system may include a base plate and a plurality of three dimensional fins coupled to the base, wherein each of the plurality of three dimensional fins comprises a first portion extending away from the base in a first direction and a second a portion extending away from the first portion in a second direction different from the first direction.

In some embodiments, a thermal management system for electronics may include a base plate configured to be coupled to one or more components of an electronic system; and a Embodiments of a thermal management system are provided herein. In some embodiments, a thermal management system may include a base plate; and a plurality of three dimensional plurality of three dimensional fins coupled to the base and at least partially extending from the base, wherein the plurality three dimensional fins are arranged substantially parallel to one another and oriented in a direction substantially similar to that of a flow of air proximate the thermal management system.

DRAWINGS

These and other features, aspects, and advantages of the present disclosure will become better understood when the following detailed description is read with reference to the accompanying drawings in which like characters represent like parts throughout the drawings, wherein.

Unless otherwise indicated, the drawings provided herein are meant to illustrate features of embodiments of this disclosure. These features are believed to be applicable in a wide variety of systems comprising one or more embodiments of this disclosure. As such, the drawings are not meant to include all conventional features known by those of ordinary skill in the art to be required for the practice of the embodiments disclosed herein.

DETAILED DESCRIPTION

In the following specification and the claims, a number of terms are referenced that have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

Embodiments of a thermal management system are provided herein. In at least some embodiments, the inventive thermal management system may comprise three dimensional fins that which are distinguished from the state of the art and advantageously facilitate an efficient thermal transfer in a natural (free) convection environment (e.g., an environment in which there is no forced air movement). As used herein, the term "three dimensional fins" refers to fins that have at least some portion with three dimensions (e.g., having separate portions oriented with respect to one another and/or a base) such as helical, spiral, wings, tabs or the like. Embodiments of the inventive thermal management system have been demonstrated up to about 20% enhancement via simulation. It may also be noted that the fins described herein employ similar packaging volume as would otherwise be available for existing fins, thereby allowing the inventive thermal management system to be utilized in existing applications without a need for modification of the underlying components (e.g., electronics).

Figure 1:
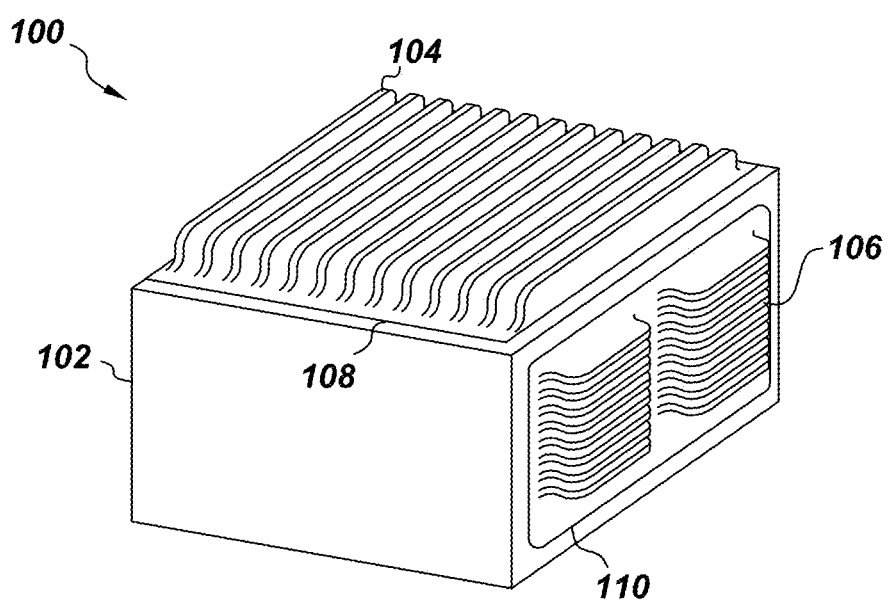
FIG. 1 shows an exemplary thermal management system having a conventional fin configuration.

Referring to FIG. 1, a conventional thermal management system 100 may generally include one or more base plates (two base plates 108, 110 shown) configured to be coupled to a device 102. The device 102 may be any device that generates heat, for example such as electronics or the like. Each base plate 108, 110 has a plurality of two-dimensional fins or posts (fins shown) 104, 106 extending away from the base plate 108, 110. As used herein, two-dimensional fins or posts are plate like or rod like and extend in a single direction away from the respective base plate 104, 106 to which the fin or post is coupled.

The inventors have observed that such conventionally configured fins (e.g., shown in FIG. 1) have limited effectiveness and are insufficient for applications where the electronics are subject to varying requirements or are exposed to dynamic or changing environments, for example, such as in aircraft electronics or avionics. For example, unlike land-based electronics, thermal management in avionics has additional challenges owing to a number of dynamic factors, such as, motion of the aircraft, changes in the magnitude and direction of gravity, and change in the surrounding temperature with altitude.

One such challenge in avionics arises from a lack of forced convection (e.g., a bulk motion of fluid via one or more external mechanisms). For example, either a limited or complete loss of cooling supply may occur during various stages of flight (e.g., landing) for extended periods of time (e.g., up to 30 minutes or more). As such, mechanisms for transfer of heat is limited to natural or free convection, that is, a motion of fluid induced purely by buoyancy forces. Such buoyancy forces arise from the differences in the density of the air, different mainly due to the presence of a temperature gradient. In such instances a rate of heat transfer depends on the available temperature difference (e.g., as a temperature difference increases, a rate of heat transfer increases). As such, natural or free convection is significantly less efficient with respect to heat transfer, as compared to forced convection.

Figure 2:
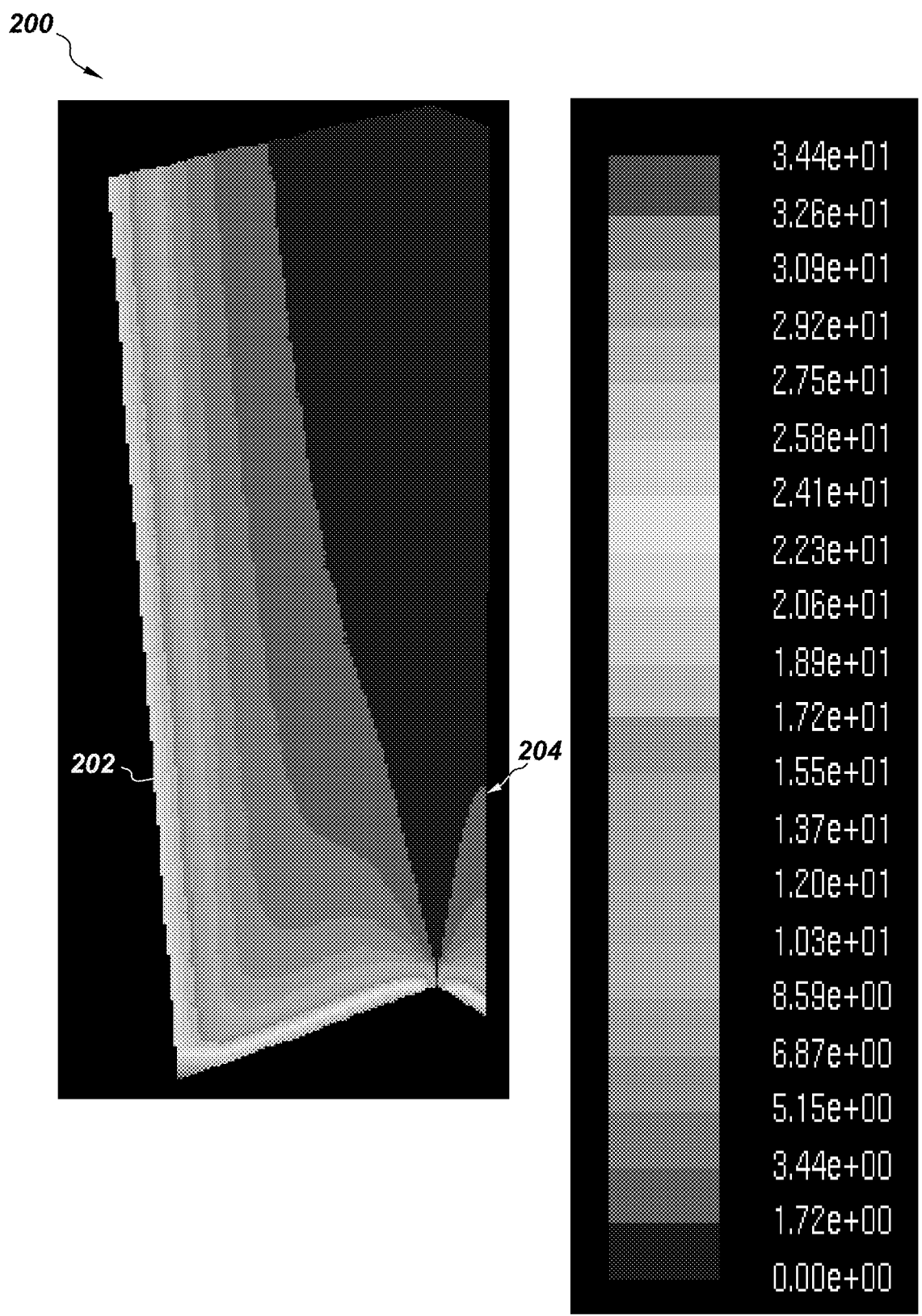
FIG. 2 shows a model for local heat-transfer coefficient for the conventional fin configuration in FIG. 1.
Figure 4:
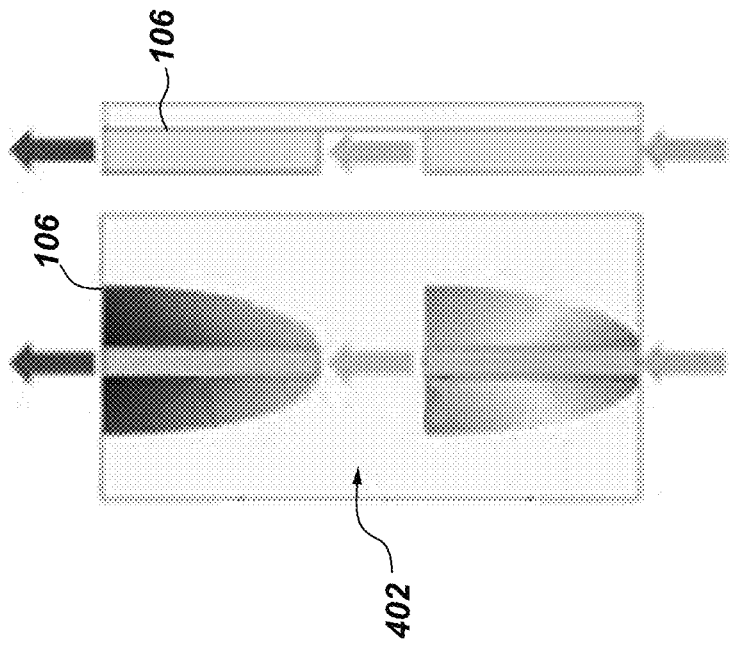
FIG. 4 is a diagram of an exemplary conventional strip fin configuration and boundary layer growth.
Figure 3:
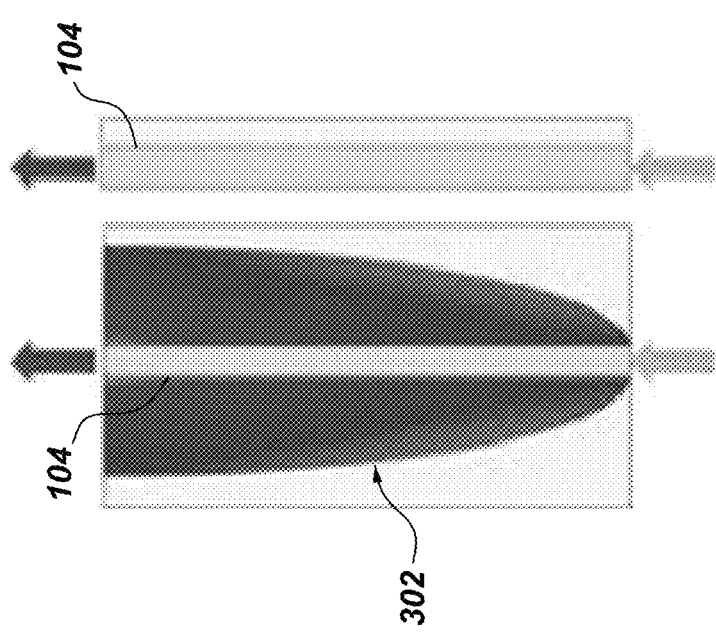
FIG. 3 is a diagram of an exemplary conventional fin configuration and boundary layer growth.

The utilization of conventional fins in natural or free convection is shown in FIGS. 2-4. In conventional two dimensional fins 104 (e.g., such as described above with respect to FIG. 1), a majority of the heat transfer occurs at the exposed fin tips 202 (e.g., a portion of the fin disposed at a furthest distance from the base), which enjoy contact with fresh, cooler air, in comparison to the fin base 204 (e.g., a portion of the fin disposed at or proximate the base plate). Such a difference in heat transfer is visually depicted at 200 in FIG. 2. Further, the boundary layers 302 grow as the flow develops, for example, such as shown in FIG. 3.

Conventional fin design and placement indicates relations to optimize the number of such fins that can be placed in a given volume such that the product of surface area and local heat transfer coefficient, which is proportional to overall heat transfer, can be maximized. Increasing a number of fins leads to an increase in surface area available to effectuate heat transfer. However, as the number of fins increase free movement of air flowing between the fins decrease, thereby limiting an overall amount of heat transfer. Conversely, decreasing the number of fins leads allows for an increase in air flow while decreasing surface area available to effectuate heat transfer, thereby also limiting an overall amount of heat transfer. As such, the inventors have observed that even an optimally numbered and positioned fins are insufficient in meeting the power density requirements of next generation products.

In addition, the inventors have observed that the inherent structure of the two dimensional fins causes the boundary layers to frequently trip and redevelop (indicated at 402), such as shown in FIG. 4. Such tripping and redevelopment of the boundary layer facilitates an increase in heat transfer. As an example, discrete fins such as pin-fins of various cross-sections such as square, ellipse, circle, etc. and strip fins (e.g., such as fins 106 shown in FIGS. 1 and 4) such are commonly employed in products with this sole purpose. These fins often perform better than the straight extruded fins or plate-fins (e.g., such as fins 104 shown in FIGS. 1 and 3) in forced convection, at the cost of increased pressure drop. However, when employed in free convection, these conventional boundary layer tripping fins, being simply extruded from the base, have a much lower surface area in comparison to continuous plate-fins. Thereby, the maximum amount of heat that can be transferred is lower than plate-fins, often by up to 40%.

As such, in some embodiments, the thermal management system as provided herein may include a plurality of three dimensional fins. The utilization of three dimensional fins provide an increased surface area available to effectuate a heat transfer while also providing a shape sufficient to cause the boundary layer to trip and redevelop, thereby further increasing heat transfer. As used herein, the term "three dimensional fins" refers to fins that have at least some portion with three dimensions (e.g., having a first portion (e.g., a plate, portion of a helical or spiral structure, or the like described below) extending away from the base in a first direction and a second portion (e.g., a wing, tab, protrusion, portion of a helical or spiral structure, or the like described below) extending in second direction different from the first direction.

Figure 5:
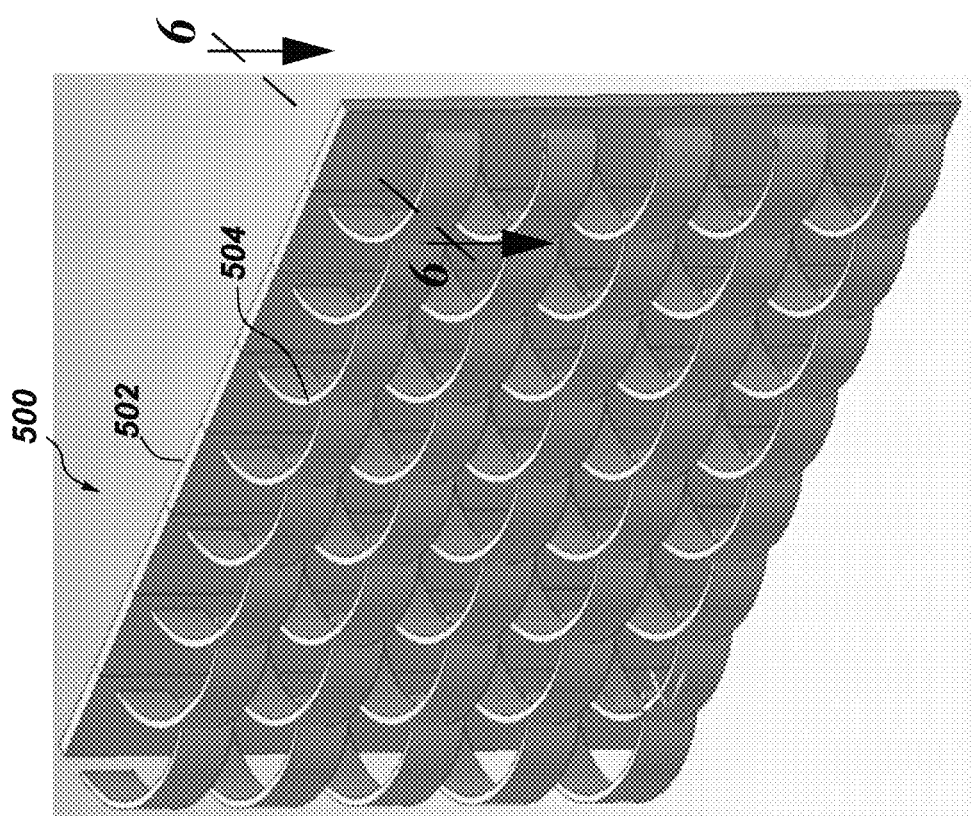
FIG. 5 is a perspective view of a thermal management system having a fin configuration in accordance with some embodiments of the present invention.
Figure 9:
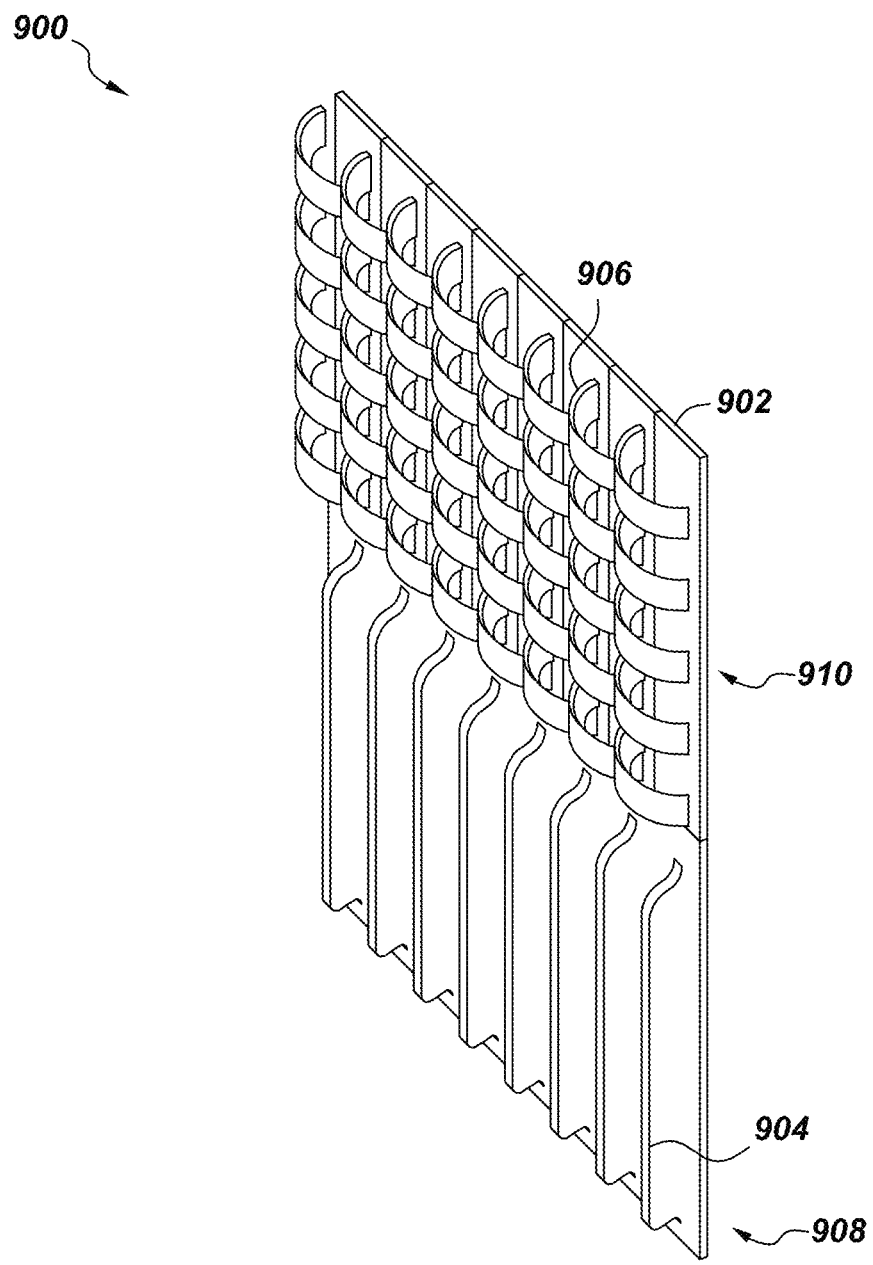
FIG. 9 is a perspective view of a thermal management system having a fin configuration in accordance with some embodiments of the present invention.

The three dimensional fins may be of any three dimensional shape suitable to provide the benefits as described above, for example, such as helical, spiral, wings, tabs or the like. For example, referring to FIG. 5, in some embodiments, the thermal management system 500 may include a base 502 and a plurality of helical or spiral shaped structures (fins 504). The fins 504 may be continuous (e.g., such as shown in FIG. 5) or may comprise a plurality of separate partially circular fins arranged in series to form an at least partially helical overall shape (e.g., such as described below with respect to FIG. 9).

Figure 6:
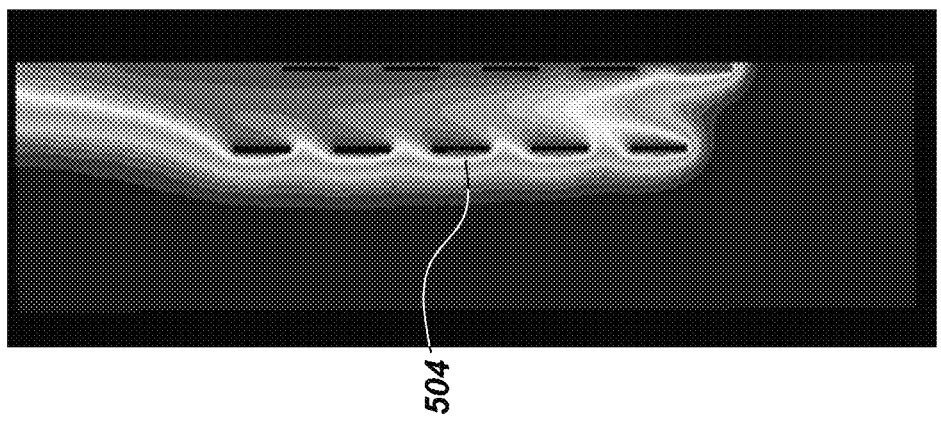
FIG. 6 shows a model for local heat transfer coefficient for the fin configuration shown in FIG. 5.

The inventors have observed that the discontinuous nature of the fins 504 may facilitate a tripping or breaking, and a regrowth of, boundary layers proximate the fins, thereby allowing cooler air to penetrate a volume between the fins 504 and base 502, thus increasing heat transfer. Moreover, the helical shape of the fins 504 nature inherently ensures the offset nature across the fins 504, thereby further contributing to heat transfer. The above described effects on the local heat transfer proximate the fins 504 is depicted in FIG. 6. Moreover, the inventors have observed that the helical or spiral shape of the fins 504 may provide a comparable surface area to an optimized number of arrangement of conventional plate-fins, however the fins 504 may provide about a 13% enhancement in heat transfer (e.g., see Table 1).

Although shown in one particular configuration, the fins 504 may be arranged in any configuration and include any number of fins 504 suitable to provide a desired amount of heat transfer. For example, the fins 504 may be arranged substantially parallel to one another and oriented in a direction substantially similar to that of a flow of air proximate the thermal management system 500, such as shown in FIG. 5. Alternatively, the fins 504 may be staggered with respect to one another and/or arranged at varying angles with respect to an expected flow of air.

In some embodiments, the three dimensional fins may include one or more features that provide an increased surface area at the fin tips (e.g., a portion of the fin disposed at a furthest distance from the base plate). The inventors have observed that a heat transfer is most active at the fins tips as compared to the remainder of the fins. Thus, by increasing surface area at the fin tips, an overall amount of heat transfer may be increased.

The one or more features may be any type of features suitable to provide the above described increase in surface area. For example, referring to FIG. 7, in some embodiments, the three dimensional fins may include a plurality of planar sections (two planar sections or first portions 704 shown) having a tip 710 and a base 712 disposed opposite the tip 710, wherein each of the planar sections 704 has one or more protrusions (one protrusion or second portion 706 per planar section shown) extending from the tip 710 of the planar sections 704.

Figure 7:
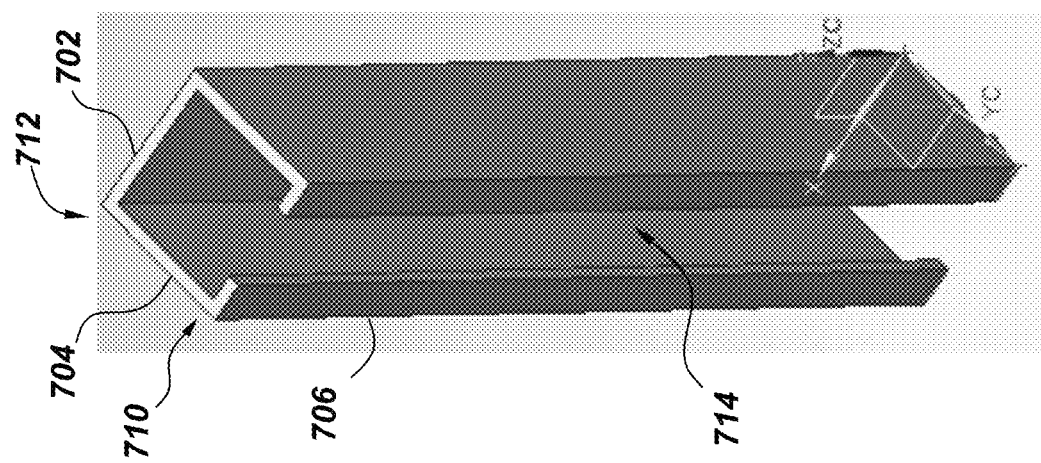
FIG. 7 is a perspective view of a thermal management system having a fin configuration in accordance with some embodiments of the present invention.

The protrusions 706 may be of any size and shape suitable to provide the above described increase in surface area. For example, in some embodiments, the protrusions 706 may include wings, winglets, tabs, or the like. The protrusions 706 may be oriented at any angle with respect to the planar sections 710, for example, such as more or less than 90 degrees, approximately perpendicular, or in some embodiments substantially perpendicular or perpendicular (such as shown in FIG. 7). In some embodiments, two of more of the protrusions 706 extend towards each other, having a gap 714 disposed between the protrusions 706, thereby providing a channel or chimney structure.

In some embodiments, the plurality of planar sections 710 may be coupled to a backplane member 702. Any number of planar sections 710 may be coupled to the backplane member 702, for example such as two (e.g., as shown in FIG. 7) or more. In some embodiments, the backplane member 702 may be configured to be coupled to a base plate (e.g., the base plate described in FIGS. 5 and 8), thereby allowing for a modular configuration, wherein separate unit cells comprising the back plane member 702 and desired number of plurality of planar sections 710 may be provided or removed to form a desired thermal management system. Alternatively, the backplane member 702 may be an integrally formed portion of the base plate, thus having a configuration similar to that shown in FIGS. 5 and 8.

The plurality of planar sections 704 may be oriented at any angle with respect to the backplane 702, for example, such as more or less than 90 degrees, approximately perpendicular, or in some embodiments substantially perpendicular or perpendicular (such as shown in FIG. 7).

Figure 8:
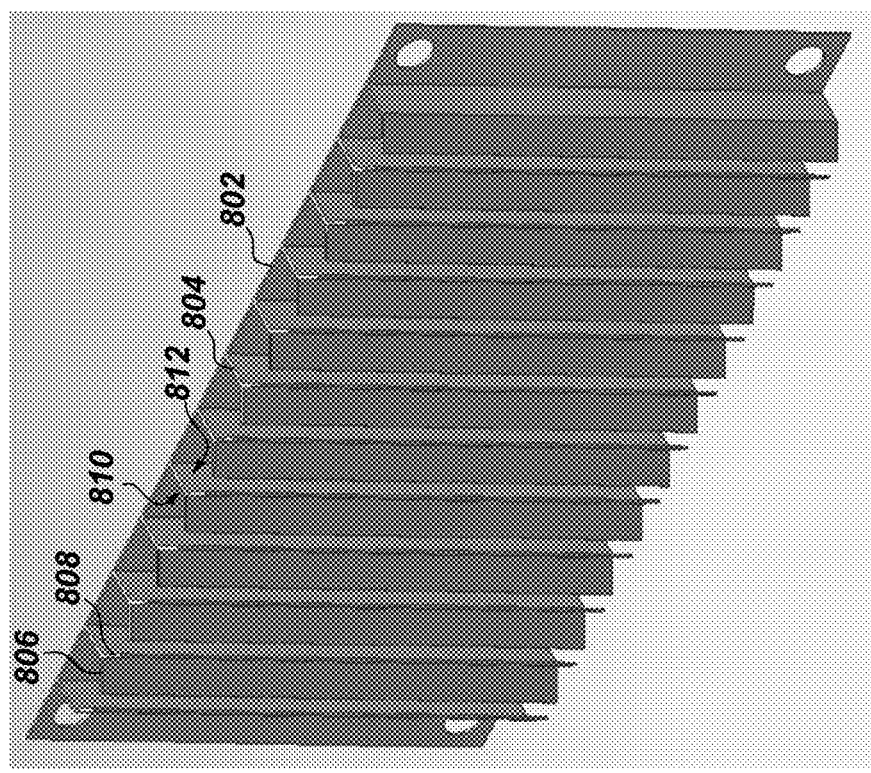
FIG. 8 is a perspective view of a thermal management system having a fin configuration in accordance with some embodiments of the present invention.

Referring to FIG. 8, in some embodiments, the one or more features may be configured such that the three dimensional fins have a "Y" or "tree" shape. For example, in some embodiments, the fins 800 may comprise a planar section 804 (e.g., similar to the planar section or first portion 710 described above) having a plurality of protrusions (collectively second portion) extending away from the planar section 804. For example, in such embodiments, the plurality of protrusions may comprise a first protrusion 806 extending from a first side 810 of the planar section 804 and/or a second protrusion 808 extending away from a second side 812 of the planar section 804. When present the first protrusion 806 and/or second protrusion 808 may be oriented in any manner or at any angle with respect to the planar section 804. In embodiments where both the first protrusion 806 and second protrusion 808 are present, the first protrusion 806 and second protrusion 808 may be disposed symmetrically or asymmetrically with respect to one another.

Figure 10:
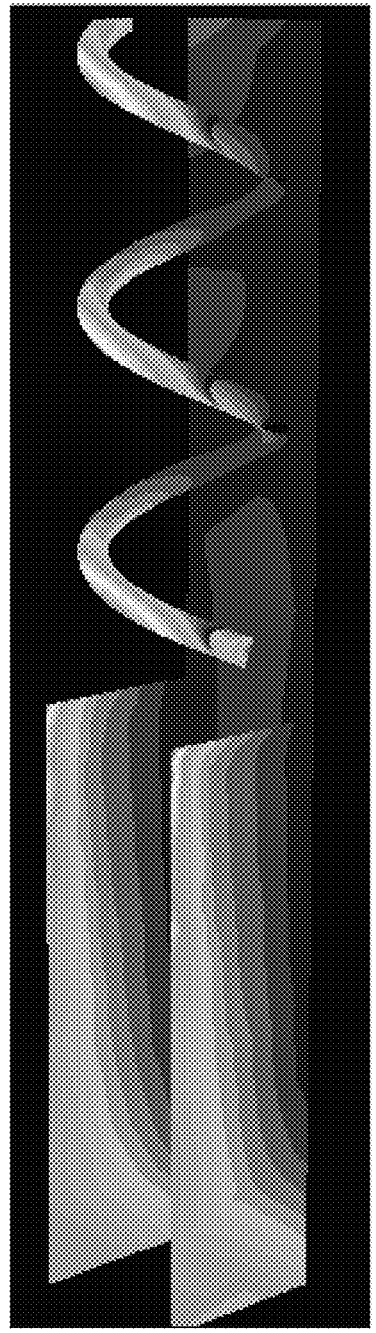
FIG. 10 shows a model for local heat-transfer coefficient for the conventional fin configuration in FIG. 9.
Figure 10:
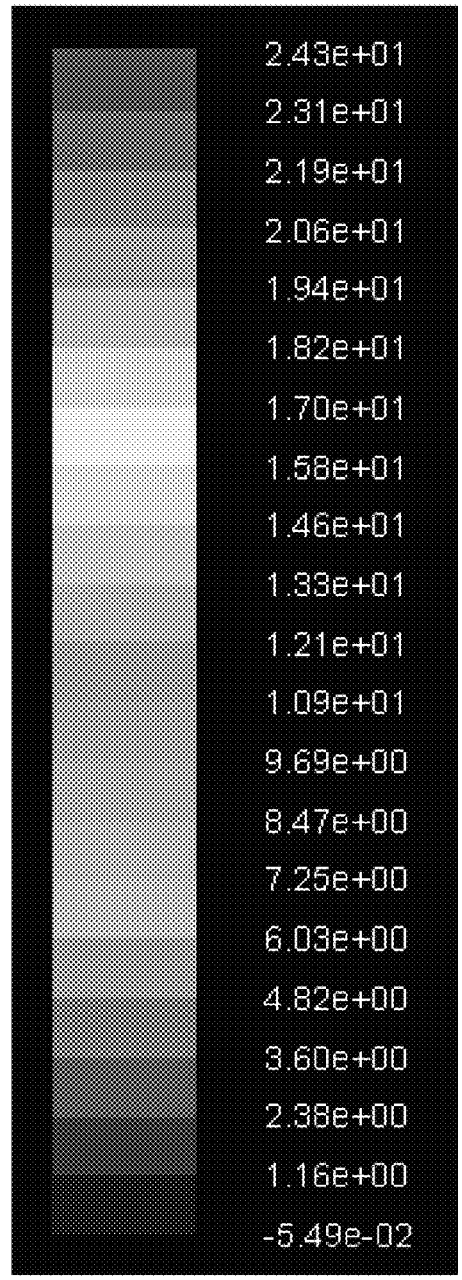

Although the above described embodiments of the thermal management system are provided in the context of the thermal management system having a single type or shape of fins, it is to be understood that the thermal management system may various configurations or combinations of any of the two or three dimensional fins described herein. For example, referring to FIG. 9, in some embodiments, the thermal management system 900 may include a base plate 902 comprising a plurality of plate-like fins 904 coupled to a first portion 908 of the base plate 902 and a plurality of helical or spiral shaped fins 906 (e.g., such as the fins 504 described above) coupled to a second portion 910 of the base plate 902. The inventors have observed that providing the plate-like fins 904 and helical or spiral shaped fins 906 in such a configuration allows for a combination of laminar flow (facilitated by the plate-like fins 904) and a tripping or breaking, and a regrowth of, the boundary layers proximate the fins (facilitated by the helical or spiral shaped fins 906). For example, a resultant combination of laminar flow and boundary layer tripping provided by such a hybrid structure is shown in the modeling data performance for the local heat transfer coefficient of FIG. 10 (visual heat transfer depiction indicated at 1000). The inventors have observed that in the configuration shown in FIGS. 9 and 10, the plurality of helical or spiral shaped fins 906 of the second portion 910 may improve a heat transfer coefficient while the plurality of plate-like fins 904 of the first portion 908 provide an increase in surface area. Such improvements may lead to, for example, about 10% augmentation (see Table 1).

In any of the above embodiments the thermal management system as described herein may be fabricated via any process suitable to form the thermal management system having a desired size and shape. For example, in some embodiments, the components of the thermal management system (base and fins) may be separately fabricated and coupled to one another via any known technique, for example welding, brazing, or the like. Alternatively, in some embodiments, the thermal management system may be fabricated as a single integral piece via extrusion, molding, casting, additive or subtractive manufacturing, or the like.

In addition, in any of the above embodiments, the thermal management system may be fabricated from any materials suitable for a desired application to facilitate a required transfer of heat. For example, in some embodiments, at least a portion of the thermal management system (e.g., the base and/or fins) may be fabricated from metal (aluminum, aluminum alloys ($AlSi_{10}Mg$ or the like), stainless steel, copper, or the like), ceramic (aluminum oxide, aluminum nitride, or the like), polymers, or the like.

Table 1 depicts heat transfer augmentation estimated through computer modeling. The computer model is first validated by comparing against experimental data, available in literature for the case of conventional fins. Several embodiments of three dimensional fins were used for illustrative purposes and other three dimensional structures and configurations are within the scope of the invention. For example, hybrid designs that leverage existing fin designs and add the three dimensional fins are further embodiments. Such modifications can be new design but can also be a retrofit or modification to an existing design to enhance thermal performance. In some embodiments the three dimensional fins are helical, winged, treed, or channeled.

The metric used for comparison in this example is an amount of heat transfer extracted per unit base area, with the base being the surface on which the fins rest (e.g., the base plate described above). The baseline structure for comparison is the optimum plate-fin heat sink configuration. Both the baseline and augmented structures have the same length and height (i.e., same design volume). All the simulations are performed at a wall temperature of 85 C, and an ambient temperature of 71 C, which reflects typical limiting conditions of some exemplary avionics. Furthermore, fin efficiencies are also computed and it is found that embodiments of the augmented structures may be more than about 95% efficient (i.e., isothermal, and at the same temperature as the base), when made of thermally conductive materials, for example such as the materials described above.

TABLE 1 baseline and augmented fin structures.

| Configuration | Spacing [mm] | Metrics-Q/S [W/mm] | Enhancement [%] |
|---|---|---|---|
| Baseline-Optimized plate-fins | 9 | 0.0118 | — |
| Hybrid Helix/Plate-fins (FIG. 9) | 12 | 0.0129 | 9.5 |
| Winged plate-fins (FIG. 7) | 9.2 mm half wing | 0.0134 | 13.5 |
| Tree/Y fins (FIG. 8) | 12.7, 6.35 mm edge | 0.014 | 18 |
| Helical strip fins (FIG. 5) | 12 | 0.0133 | 13 |

While only certain embodiments have been illustrated and described, other embodiments are within the scope of the invention. For example, other designs may include helical structures of some cross-section portion. Heat sinks are used in a variety of heat generation equipment; hence the disclosed structures can be employed in applications other than those discussed.

As such, embodiments of a thermal management system have been provided herein. In at least some embodiments, the inventive thermal management system as described above may advantageously utilize three dimensional fins to improve free convection capability and therefore, improve thermal performance. Such improved capability and performance may allow for an increased power density and a reduction in weight, thereby providing significant fuel savings in applications such as avionics. Moreover, in avionics applications, the inventive thermal management system reduces or eliminates the need for aircraft supplied air, which reduces the additional equipment used to accommodate conventional systems, thereby further reducing weight. Moreover, the inventive thermal management system may be readily integrated into existing products, such as by swapping the heat sinks and chassis walls with the presently disclosed designs, without the need to redesign/change other aspects.

Exemplary embodiments of methods, systems, and apparatus for thermal management are not limited to the specific embodiments described herein, but rather, components of systems and/or steps of the methods may be utilized independently and separately from other components and/or steps described herein. For example, the methods may also be used in combination with other thermal management systems, and are not limited to practice with only the systems and methods as described herein. Rather, the exemplary embodiment can be implemented and utilized in connection with many other applications, equipment, and systems that may benefit from reduced cost, reduced complexity, commercial availability, improved reliability at high temperatures, and increased memory capacity.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A thermal management system comprising:
a base plate; and
at least two three dimensional fins integrally formed from the base plate into a single integral component, wherein each fin of the three dimensional fins are spaced apart from each other, wherein each fin of the plurality of three dimensional fins comprises a first portion extending away from the base plate in a first direction and a second portion extending away from the first portion in a second direction different from the first direction, wherein each fin of the three dimensional fins comprises an end disposed at a farthest distance from the base plate, and wherein the end comprises a tip, wherein the plurality of three dimensional fins is coupled to a first portion of the base plate, wherein a plurality of plate-like fins is coupled to a second portion of the base plate, wherein the plurality of plate-like fins facilitates a laminar flow thereover, and wherein the plurality of three dimensional fins facilitates a boundary layer regrowth thereover.

2. The thermal management system of claim 1, wherein each first portion comprises a planar section having the tip and a base disposed opposite the tip and each second portion comprises one or more protrusions extending from the tip of the planar section.

3. The thermal management system of claim 2, wherein the one or more protrusions comprise at least one of a first protrusion extending away from a first side of the planar section or a second protrusion extending away from a second side of the planar section.

4. The thermal management system of claim 2, wherein the one or more protrusions are wings, winglets or tabs.

5. The thermal management system of claim 2, wherein at least one protrusion from a three dimensional fin extends towards another protrusion from an adjacent three dimensional fin, forming a gap there between.

6. The thermal management system of claim 2, wherein the planar section is coupled to a backplane member, wherein the planar section is coupled to the base plate via the backplane member, and wherein the backplane member is integrally formed with the base plate.

7. The thermal management system of claim 1, wherein the plurality of plate-like fins is oriented in a direction that is parallel with a direction of orientation of the three dimensional fins.

8. The thermal management system of claim 1, wherein each fin of the three dimensional fins further comprises a Y-shape at the tip.

9. The thermal management system of claim 1, wherein the three dimensional fins are arranged parallel to one another and oriented in a direction aligned with a flow of air proximate the thermal management system, and wherein each fin of the plurality of three dimensional fins further comprises three or more protrusions at the tip.

10. A thermal management system for electronics, comprising:

a base plate configured to be coupled to one or more components of an electronic system; and at least two three dimensional fins coupled to the base plate and at least partially extending from the base plate, wherein the plurality of three dimensional fins is arranged parallel to one another and oriented in a direction matching that of a flow of air proximate the thermal management system, wherein the three dimensional fins are at least partially composed of at least one of aluminum and copper, wherein the plurality of three dimensional fins is coupled to a first portion of the base plate and wherein a plurality of plate-like fins is coupled to a second portion of the base plate, and wherein the three dimensional fins comprises a helical or spiral structure.

11. The thermal management system of claim 10, wherein the plurality of three dimensional fins is directly coupled to the base plate.

12. The thermal management system of claim 10, wherein each first portion comprises a planar section having a tip and a base disposed opposite the tip and each second portion comprises one or more protrusions extending from the tip of the planar section.

13. The thermal management system of claim 12, wherein the one or more protrusions comprise at least one of a first protrusion extending away from a first side of the planar section and a second protrusion extending away from a second side of the planar section, wherein the first protrusion and the second protrusion are disposed asymmetrically with respect to each other.

14. The thermal management system of claim 13, wherein the one or more protrusions are wings, winglets or tabs.

15. The thermal management system of claim 14, wherein at least one protrusion from a three dimensional fin of the plurality of three dimensional fins extends towards another protrusion from an adjacent three dimensional fin, forming a space there between, and wherein the spacing between adjacent three dimensional fins is between 6.35 mm and 12.7 mm.

* * * * *